United States Patent [19]

Pendleton

[11] Patent Number: 5,015,339

[45] Date of Patent: May 14, 1991

[54] PROCESS FOR PREPARING NONCONDUCTIVE SUBSTRATES

[75] Inventor: Phillip Pendleton, Cheshire, Conn.

[73] Assignee: Olin Hunt Sub III Corp., Cheshire, Conn.

[21] Appl. No.: 499,229

[22] Filed: Mar. 26, 1990

[51] Int. Cl.$^5$ .......................... C25D 5/02; C25D 5/54
[52] U.S. Cl. ....................................... 204/15; 204/20; 204/26
[58] Field of Search ...................... 204/15, 20, 26, 38.4

[56] References Cited

U.S. PATENT DOCUMENTS

| | | | |
|---|---|---|---|
| 3,962,496 | 6/1976 | Leech | 427/306 |
| 4,042,729 | 8/1977 | Polichette et al. | 427/304 |
| 4,054,693 | 10/1977 | Leech et al. | 427/304 |
| 4,073,740 | 2/1978 | Polichette et al. | 252/156 |
| 4,233,344 | 11/1980 | Brasch | 427/304 |
| 4,310,154 | 2/1984 | Stahl et al. | 156/651 |
| 4,425,380 | 1/1984 | Nuzzi et al. | 427/97 |
| 4,592,852 | 6/1986 | Courduvelis et al. | 252/79.1 |
| 4,592,929 | 6/1986 | Tubergen et al. | 427/98 |
| 4,601,784 | 7/1986 | Krulik | 156/655 |
| 4,619,741 | 10/1986 | Minten et al. | 204/15 |
| 4,622,107 | 11/1986 | Piano | 204/15 |
| 4,622,108 | 11/1986 | Polakovic et al. | 204/15 |
| 4,629,636 | 12/1986 | Courduvelis et al. | 427/444 |
| 4,631,117 | 12/1986 | Minten et al. | 204/15 |
| 4,684,560 | 8/1987 | Minten et al. | 428/131 |
| 4,698,124 | 10/1987 | Krulik | 156/642 |
| 4,718,993 | 1/1988 | Cupta et al. | 204/15 |
| 4,724,005 | 2/1988 | Minten et al. | 106/307 |
| 4,874,477 | 10/1989 | Pendleton | 204/15 |
| 4,897,164 | 1/1990 | Piano et al. | 204/15 |

FOREIGN PATENT DOCUMENTS

| | | |
|---|---|---|
| 54-055933 | 9/1979 | Japan . |
| 54-117328 | 9/1979 | Japan . |
| 56-003373 | 1/1981 | Japan . |

OTHER PUBLICATIONS

Technical Paper, "An evaluation of PWB Glass Conditioning Mechanisms" by Phillip Pendleton, Apr. 23-28, 1989.

Magnifloc 409C Flocculant (Cyanamid).

Primary Examiner—T. M. Tufariello
Attorney, Agent, or Firm—William A. Simons

[57] ABSTRACT

The process of electroplating a metal layer to the surface of a nonconductive material which comprised the steps:
(a) contacting said substrate surface with an alkaline permanganate solution for an effective time and at an effective concentration and at an elevated temperature to prepare said substrate surface for a metal layer to be electroplated thereto;
(b) then contacting said substrate surface with an aqueous neutralizer/conditioner solution, said solution comprising water, at least one neutral or acidic reducing agent, and at least one polyelectrolyte polymer conditioner;
(c) then contacting said substrate with a liquid dispersion of carbon black comprised of:
(1) carbon black particles having an average particle size of less than about 3 microns in said dispersion;
(2) an effective dispersing amount of a surfactant which is compatible with said carbon black; and
(3) a liquid dispersing medium, wherein the amount of carbon black is sufficient to coat substantially all of the nonconducting substrate surface and is less than about 4% by weight of said liquid dispersion;
(d) separating substantially all of the liquid dispersing medium from said applied dispersion, thereby depositing said carbon black particles in a substantially continuous layer on said nonconductive substrate surface; and
(e) electroplating a substantially continuous metal layer over the deposited carbon black layer on said nonconduting substrate surface.

A neutralizer/conditioner solution comprising a mixture of water, at least one neutral or acidic reducing agent, and at least one polyelectrolyte polymer conditioner.

18 Claims, No Drawings

PROCESS FOR PREPARING NONCONDUCTIVE SUBSTRATES

BACKGROUND OF THE INVENTION

1. Field of the Invention

This invention relates to a process for preparing a nonconductive substrate for electroplating. Further, this invention relates to an improved process for preparing the through hole walls of a printed wiring board (PWB) for electroplating. Still further, this invention relates to an aqueous neutralizer/conditioner solution.

2. Brief Description of Prior Art

For the past thirty years the printed wiring board industry has relied on the electroless copper deposition process to prepare through hole walls in printed wiring boards for electroplating. These plated through hole walls are necessary to achieve connections between two metal circuit patterns on each side of a printed wiring board or, in addition to this, between the inner layer circuit patterns of a multilayer board.

The electroless deposition of copper onto the through hole walls typically consists of precleaning a PWB and then processing according to the following sequence of steps:

Step 1. Preactivator
Step 2. Pd/Sn Activator
Step 3. Rinse
Step 4. Accelerator
Step 5. Rinse
Step 6. Electroless Copper Deposition
Step 7. Electroplating These processed boards may also be photoimaged before the electroplating process. Typically, the deposited copper layer on each through hole wall is about 1±0.2 mil thick.

Conventional electroless processes have several commercial disadvantages. They require a relatively long process time. The multiple treatment baths have complex chemistry which may require constant monitoring and individual ingredients which may require separate replenishment. The palladium/tin activator also may require expensive waste treatment. Furthermore, these electroless process baths may be very sensitive to contamination. Finally, the multiplicity of rinse baths may require large amounts of water.

Prior to the electroless method of plating through holes, graphite was employed to prepare the walls of the through holes for plating. For example, U.S. Pat. No. 3,099,608, which issued to Radovsky et al. on July 30, 1963, teaches a process for preparing the through hole walls of printed circuit boards for electroplating by initially depositing in said through holes a thin electrically nonconductive film of palladium metal in at least a semi-colloidal form. The patent discloses that graphite had been used previously as a conductive layer for electroplating thereon. See column 1, lines 63-70 and column 4, line 72 to column 5, line 11. These patentees noted several deficiencies with that graphite process including lack of control of the graphite application, poor deposit of the resultant electroplated metal, nonuniform through hole diameters, and low electrical resistance of the graphite.

U.S. Pat. No. 3,163,588, which issued to Shortt et al. on Dec. 29, 1964, also mentions that graphite or its equivalents may be employed to render through hole walls of electric circuit boards conductive for later electroplating metals thereon. See column 3, line 45 to column 4, line 2.

U.S. Pat. No. 4,581,301, which issued to Michaelson on Apr. 8, 1986, teaches the application of a seed layer of conductive particles, such as "carbon", on the walls of through holes before electrolytically plating copper over the seed layer. This reference does not explicitly teach the use of a continuous layer of carbon black dispersion in the seed layer, and does not recognize the advantage of using very small particles of carbon black such as presently claimed. See column 7, lines 63-66 which refer to particles passing through a 400 mesh screen. A 400 mesh screen is equivalent to about 35 microns.

Separately, graphite has been employed in numerous processes for preparing a nonconducting material for a metal coating or plating. For example, U.S. Pat. No. 409,096, which issued to Alois Blank on Aug. 13, 1889, teaches a process for applying copper to asbestos roofing material which comprises first applying powdered plumbago (graphite) in a volatile liquid such as varnish to the surface of the asbestos, then evaporating the volatile liquid to coat the asbestos fibers with fine particles of plumbago. The plumbago coated asbestos sheets are then immersed in a copper electroplating solution and electric current is applied to the coated asbestos sheet to form a thin film of copper thereon. The copper coated sheet is then immersed in a bath of molten metal such as tin, lead, or zinc, and is then removed from the molten bath to effect solidification of the molten metal. The resulting metal coated asbestos sheet is described as being relatively flexible, a nonconductor of heat and substantially fireproof.

U.S. Pat. No. 1,037,469, which issued to Goldberg on Sept. 3, 1912, and U.S. Pat. No. 1,352,331, which issued to Unno on Sept. 7, 1920, disclose processes for electroplating nonconducting materials by first coating the nonconducting material with wax, then coating the wax with a slurry of finely divided particles of graphite or other metal, followed by electroplating of the dust-coated surface with copper or other metal. Neither of these processes are particularly suitable for use in coating the hole walls of circuit boards because the holes are normally extremely narrow in diameter and immersing in wax would tend to plug the hole and prevent coating the hole walls with an electroplating material.

U.S. Pat. No. 2,243,429, which issued to Laux on May 27, 1941, discloses a process for electroplating a nonconductive surface by "graphiting" a thin layer onto the nonconducting surface followed by applying a copper layer electrolytically and "finally a further electrolytic deposit of another metal" is placed thereon.

Separately, carbon black formulations have been employed as conductive coatings for nonconductive materials. For example, U.S. Pat. No. 4,035,265, which issued to Saunders on July 12, 1977, discloses conductive paint compositions containing both graphite and carbon black along with air-hardenable binder. These paints are suitable for application to the walls of a building for use as a heating element.

U.S. Pat. No. 4,090,984, which issued to Lin et al. on May 23, 1978, teaches a semi-conductive coating for glass fibers comprising (a) a polyacrylate emulsion; (b) electrically conductive carbon black dispersion and (c) a thixotropic gelling agent. The conductive carbon black dispersions employed are those comprising electrically conductive carbon black dispersed in from about 3 to about 4% by weight of a suitable dispersing agent.

U.S. Pat. No. 4,239,794, which issued to Allard on Dec. 16, 1980, teaches dispersing a conductive carbon black in a latex binder with a selected dispersing agent, then impregnating this carbon black dispersion into a nonwoven fibrous web followed by drying any residual water, leaving a thin coating of carbon black dispersed on the surfaces of said fibers.

U.S. Pat. Nos. 4,619,741; 4,684,560 and 4,724,005, which issued to Karl L. Minten and Galina Pismennaya, on Oct. 28, 1986; Aug. 4, 1987; and Feb. 9, 1988, respectively, teach a process of electroplating the through holes of a PWB which is a significant improvement over the known electroless techniques. By this process, a liquid dispersion of carbon black particles is first applied to the nonconductive portions of the through holes; then the liquid dispersion medium is separated (i.e., evaporated) from the carbon black particles, thereby depositing a substantially continuous layer of carbon black particles on the nonconductive surfaces of the through holes; and next a substantially continuous metal layer is electroplated over the deposited carbon black layer. This process of Minten and Pismennaya has several advantages over the known electroless techniques including the elimination of the preactivator, the Pd/Sn activator and the accelerator; less possibility of pollution problems; better bath stability; and fewer possible side reactions. This disclosure of the above-mentioned U.S. Patents of Minten and Pismennaya is incorporated herein by reference in their entirety.

Improvements and modifications of this Minten and Pismennaya process are shown in U.S. Pat. No. 4,622,107 (Piano); U.S. Pat. No. 4,622,108 (Polakovic and Piano); U.S. Pat. No. 4,631,117 (Minten, Battisti, and Pismennaya); and U.S. Pat. No. 4,718,993 (Cupta and Piano); U.S. Pat. No. 4,874,477 (Pendleton) and U.S. Pat. No. 4,897,164 (Piano and Galvez). The first of these patents teaches the use of a gas-forming compound (e.g. sodium carbonate) to remove loose or easily removable carbon black particles in the through holes. The second of these patents teaches the contacting of an alkaline hydroxide preconditioning solution to the through hole walls before application of the carbon black dispersion so that the carbon black dispersion will have better adhesion to the walls. The third listed patent teaches the use of this carbon black dispersion as a preactivator for electroless plating of the through holes. The fourth teaches the use of an alkaline silicate solution before the carbon black dispersion. The fifth patent teaches the use of an aqueous polyelectrolyte homopolymer conditioner solution before the carbon black dispersion bath. The sixth patent teaches the use of an alkaline borate solution to remove excess carbon black material on the rims and inner metal walls of the PWB through hole walls which might cause an undesirable, uneven plated surface to result. These six U.S. Patents are incorporated herein by reference in their entireties.

One problem present with multilayer PWB through holes is that the drilling of the holes causes resin smear on the exposed conductive metal (e.g., copper) inner layers on the holes. The resin smear may act as an insulator between the later plated-on metal in the through hole and these inner metal layers. Thus, this smear may result in poor electrical connections. The smear should be removed (i.e., "desmeared") before the plating-on operation.

Various alkaline permanganate treatments have been used as standard methods for desmearing surfaces of printed wiring boards including the through holes of printed wiring boards. Such permanganate treatments have been employed for reliably removing smear/drilling debris and texturizing or micro-roughening exposed PWB epoxy surfaces. This latter effect significantly improves copper-to-epoxy resin adhesion.

Generally, permanganate treatment involves three different treatment solutions used sequentially. They are (1) a solvent swell solution, (2) a permanganate desmear solution, and (3) a neutralization solution. Typically, a printed wiring board is dipped or otherwise exposed to each solution with deionized water rinse baths employed between each of these three treatment solutions.

Numerous U.S. and foreign patents and published foreign patent applications have issued which teach different permanganate desmearing and neutralization compositions and/or desmearing or neutralization operations. U.S. Pat. No. 3,962,496 (Leech) teaches of a hydrazine neutralizer solution containing a sequestering agent (e.g. ethylenediamine tetraacetic acid, sodium tartrate, and triethanolamine) and a pH adjustor (e.g. sodium hydroxide, potassium hydroxide, and sodium carbonate).

U.S. Pat. No. 4,042,729 (Polichette et al.) and U.S. Pat. No. 4,073,740 (Polichette et al.) teach a composition for treating a resinous surface to later receive a deposit of electrolessly-formed metal, said composition comprising water, permanganate ion and manganate ion, wherein the molar ratio of manganate ion to permanganate ion is up to 1.2 to 1 and said composition having a pH in the range of 11 to 13.

U.S. Pat. No. 4,054,693 (Leech et al.) teaches a process of treating a resinous surface by first contacting that surface with the same permanganate ion/manganate ion solution as used in the preceding two patents, then neutralizing the treated resin surface with an aqueous solution comprising hydrazine and then following that neutralization with metallizing that resinous surface with an electroless metal deposition bath.

U.S. Pat. No. 4,233,344 (Braach) teaches treating a composite substrate with a copper-type colloidial system to cause activation of the nonconductive portions thereof for electroless metal deposition, and thereafter treating the activated substrate with an adhesion promoter (i.e., hydrazine hydrate, ammonium persulfate, or alkali hydroxide) prior to electroless metal deposition.

U.S. Pat. No. 4,425,380 (Nuzzi et al.) teaches a process for preparing a resinous substrate for subsequent metallization, said process comprising first contacting the substrate with an alkaline permanganate treating solution, then contacting said substrate with a water-soluble compound (e.g., tin chloride, sodium bisulfite, hydrochloric acid, or hydroxylamine hydrochloride) to reduce any manganese residues deposited on said substrate to a low oxidation state, and finally contacting said substrate with an alkaline hydroxide solution to remove essentially all of said manganese residues.

U.S. Pat. No. 4,430,154 (Stahl et al.) teaches a process for making printed circuit boards involving the steps of removing an adhesive coating by treating the board with an aqueous solution containing potassium permanganate and sodium hydroxide, and thereafter treated with an aqueous solution of hydrochloric acid or hydrazine hydrate.

U.S. Pat. No. 4,515,829 (Deckert et al.) teaches an overall process for manufacturing a printed circuit board having a plurality of metal plated holes interconnecting at least two circuits, including the steps of drilling holes in an epoxy board, forming the circuits, contacting the hole walls with an aqueous alkaline oxygenated epoxy solvent at a pH greater than 10, then contacting the holes with an aqueous alkaline permanganate solution at an elevated temperature and a pH in excess of 13, and also contacting the hole walls with a reducing agent solution.

U.S. Pat. No. 4,592,852 (Courduvelis et al.) teaches an alkaline composition to improve the adhesion of plastics to electroless metal deposits, said composition containing a source of permanganate ions and a secondary oxidant selected from the group consisting of chlorine, bromine, ozone, hypochlorite salts, metaperiodate salts and trichloro-s-triazinetrione salts.

U.S. Pat. No. 4,592,929 (Tubergen et al.) teaches a process for the metallization of a plastic which includes the steps of first treating the plastic with a liquid permanganate oxidant solution, then contacting the plastic with a solution containing a reducing agent, a pH adjustor to render the reducing agent active, and a surface active agent in sufficient concentration to reduce the surface tension of the solution to 50 dynes per centimeter or less.

U.S. Pat. No. 4,601,784 (Krulik) teaches an aqueous alkaline sodium permanganate solution comprising water, an alkali metal hydroxide, sodium permanganate, and 0.1 to about 3.0 moles of $K^+$, $Cs^+$, $Rb^+$ ions, or mixtures thereof, per mole of permanganate ion.

U.S. Pat. No. 4,629,636 (Courduvelis et al.) teaches a process to improve the adhesion of a plastic to an electroless metal deposit wherein said plastic is contacted with an alkaline permanganate solution which contains permanganate ions, manganate ions, and a secondary oxidant; the secondary oxidant being added at controlled intervals to keep the ratio of permanganate ion concentration to the sum of permanganate and manganate ion concentrations above about 0.5.

U.S. Pat. No. 4,698,124 (Krulik) teaches a method for regenerating spent permanganate ions in a permanganate-containing etchant composition comprising periodically adding an oxidizer selected from the group consisting of an inorganic peroxy disulfate, mixtures of an inorganic peroxy disulfate, and an inorganic hypochlorite, and mixtures of an organic peroxy disulfate, and an inorganic chlorate in an amount to oxidize essentially all of the nonpermanganate manganese species in the composition to permanganate.

Japanese Patent No. 81-003373 (which issued on Jan. 24, 1981) and Japanese Patent No. 81-015736 (which issued on Apr. 11, 1981) teach the use of alkaline solutions of potassium permanganate and sodium or potassium hypochlorite in the treatment of ABS resins prior to electroless metal plating. The alkaline solutions include those having a pH in the range of 11.0 to 12.35 and 12.0 to 13.5, respectively.

Japanese Kokai No. 79-055933 and Japanese Kokai 79-117,328, the latter published on Sept. 12, 1979, teach an electroless plating on plastics process involving etching the plastics with aqueous solution containing potassium permanganate and persulfate prior to electroless metal plating. All of the above U.S. and foreign patents and patent publications are incorporated herein by reference in their entireties.

It is a primary object of this invention to provide an improved electroplating process for applying a conductive metal layer to a nonconducting material such as the through hole walls of printed wiring boards over the process disclosed in the above-noted Minten and Pismennaya patents.

It is also an object of the present invention to provide a unified permanganate desmearing operation with the carbon black dispersion preplating operation disclosed in the above-noted Minten and Pismennaya patents.

It is another object of the present invention to provide a unified permanganate desmearing/carbon black dispersion preplating operation whereby the neutralization treatment of the desmearing operation and the conditioning treatment of the preplating operation is combined into one step.

It is still another object of this invention to provide an even more economical and environmentally safe process for applying a conductive metal layer to the surfaces of nonconducting layers of printed wiring boards than presently known combined permanganate/electroless processes.

BRIEF SUMMARY OF THE INVENTION

Accordingly, the present invention accomplishes the foregoing objects by providing a process for electroplating a conductive metal layer to the surface of a nonconductive material which comprises the steps:

(a) contacting said substrate surface with an alkaline permanganate solution for an effective time and at an effective concentration and at an elevated temperature to prepare the substrate surface for a metal layer to be later electroplated thereto;

(b) then contacting said substrate surface with an aqueous neutralizer/conditioner solution, said solution comprising water, at least one neutral or acidic reducing agent, and at least one polyelectrolyte polymer conditioner;

(c) then contacting said substrate surface with a liquid dispersion of carbon black comprised of:
  (1) carbon black particles having an average particle size of less than about 3.0 microns in said dispersion;
  (2) an effective dispersing amount of a surfactant which is compatible with said carbon black; and
  (3) a liquid dispersing medium, wherein the amount of carbon black is sufficient to coat substantially all of the nonconducting substrate surface and is less than about 4% by weight of said liquid dispersion;

(d) separating substantially all of the liquid dispersing medium from said applied dispersion, thereby depositing said carbon black particles in a substantially continuous layer on said nonconducting substrate surface; and (e) electroplating a substantially continuous metal layer over the deposited carbon black layer on said nonconducting substrate surface.

The process of this invention is particularly useful for applying a conductive metal surface such as copper to the nonconducting portions of through hole walls of printed wiring boards. These printed wiring boards are usually composed of a nonconductive layer (e.g., epoxy resin/glass fiber mixture) positioned between two conductive metal layers (e.g., copper or nickel plates or foils) or a multiplicity of said alternating layers. Applying a conducting metal layer over said nonconducting portions of said through hole walls electrically connects the conductive metal layers. However, the process of this invention is effective for electroplating a conductive metal onto the surface of a nonconducting material (e.g., nonconductive plastics or resins or ceramics) of virtually any shape or surface area.

The present invention is also directed to said aqueous neutralizer/conditioner solution, as a composition-of-matter, comprising water, at least one neutral or acidic reducing agent, and at least one polyelectrolyte polymer conditioner.

DESCRIPTION OF THE PREFERRED EMBODIMENTS

As stated above, one preferred embodiment of the present invention is preparing the through hole walls of a printed wiring board for the application of an electroplated layer of metal. Printed wiring boards (also known as printed circuit boards) are generally laminated materials comprised of two or more plates or foils of copper, which are separated from each other by a layer of nonconducting material. Although copper is generally used as the electroplating metal in printed wiring boards, those skilled in the art will recognize that other metals such as nickel, gold, palladium, silver and the like can also be electroplated by the process of this invention. The nonconducting layer or layers are preferably an organic material such as an epoxy resin impregnated with glass fiber particles. However, the nonconducting layer may also be comprised of thermosetting resins, thermoplastic resins, and mixtures thereof, with or without reinforcing materials such as fiberglass and fillers.

Suitable thermoplastic resins include the acetal resins; acrylics, such as methyl acrylate; cellulosic resins, such as ethyl cellulose, cellulose acetate, cellulose propionate, cellulose acetate butyrate, cellulose nitrate, and the like; chlorinated polyethers; nylon; polyethylene; polypropylene; polystyrene; styrene blends, such as acrylonitrile styrene copolymers and acrylonitrile-butadiene-styrene (ABS) copolymers; polycarbonates; polychlorotrifluoroethylene; and vinyl polymers and copolymers, such as vinyl acetate, vinyl alcohol, vinyl butyral, vinyl chloride, vinyl chlorideacetate copolymer, vinylidene chloride and vinyl formal; and the like.

Suitable thermosetting resins include alkyl phthalate; furane; melamine-formaldehyde; phenol formaldehyde and phenol-furfural copolymers; alone or compounded with butadiene acrylonitrile copolymer or acrylonitrile-butadiene-styrene (ABS) copolymers; polyacrylic esters; silicones; urea formaldehydes; epoxy resins; polyimides; alkyl resins; glyceryl phthalates; polyesters; and the like.

In many printed wiring board designs, the electrical pathway or pattern requires a connection between the separated copper plates at certain points in the pattern. This is usually accomplished by drilling holes at the desired locations through the laminate of copper plates and the nonconducting layer and then connecting the separate metal plates. The hole diameters of printed wiring boards generally range from between about 0.5 and about 10 millimeters in diameter, and preferably from about 1 to about 5 millimeters.

After drilling these through holes, it may be desirable to deburr the holes to make the hole walls relatively smooth. In the case of multilayer printed wiring boards, it may also be desirable to subject the boards to desmear or etchback operations to clean the inner copper interfacing surfaces of the through holes.

According to the present invention, printed wiring boards having drilled through holes are treated with a specific alkaline permanganate treatment before contacting the PWB with a carbon black dispersion preplating treatment. This specific alkaline permanganate treatment generally comprises three separate treatments—an optional epoxy resin swell treatment, an alkaline permanganate treatment, and a neutralizer/conditioner treatment.

The optional epoxy resin swell treatment involves contacting the PWB with a suitable swelling agent. This may include an aqueous alkaline solution containing an alkali metal hydroxide and at least one glycol ether or other suitable solvent. Alternatively, the swelling agent may be a nonaqueous solvent (e.g., N-methylpyrrolidone). Generally, it is preferred to use a combination of an alkali metal hydroxide and a glycol ether mixture. One preferred mixture of glycol ethers is a mixture of butyl cellosolve, butyl carbitol, and ethylene glycol. Butyl cellosolve is also known as 2-butoxy ethanol or ethylene glycol monobutyl ether and has the chemical formula: $C_4H_9OC_2H_4OH$. Butyl carbitol is also known as diethylene glycol monobutyl ether; butoxydiethylene glycol; or 2-(2-butoxyethoxy)ethanol and has the chemical formula: $C_4H_9O(C_2H_4O)_2H$. Ethylene glycol is also known as glycol or 1,2-ethanediol and has the chemical formula: $HOC_2H_4OH$.

Preferably, this epoxy resin swell treatment is carried out by dipping the PWB having the drilled through holes into an aqueous bath containing the above-noted ingredients at an elevated temperature (e.g., about 40°-80° C.) for a short period of time (e.g., about 3 to 15 minutes). A preferred epoxy swell product is available as PERMOLIN 701 by Olin Hunt Specialty Products Inc. of West Paterson, N.J.

Next, the printed wiring board is contacted with an alkaline permanganate solution, preferably containing an alkaline hydroxide, an alkaline permanganate, an alkaline manganate (produced in situ), and optionally, a secondary oxidizer such as alkaline hypochlorite or alkaline persulfate. Other ingredients may also be used. The present invention encompasses the use of any alkaline permanganate treatment conventionally used for this purpose which will be compatible with neutralizer/conditioner solution employed in the next step. The term "alkaline", as used herein in both the specification and the claims, means compounds containing ammonium, alkali metal, and alkaline earth metal ions.

One preferred alkaline permanganate treatment is to place the drilled PWB in an aqueous bath containing an aqueous alkaline permanganate solution for about 5 to 30 minutes, heated to a temperature of about 50° C. to 90° C. at a concentration to effectively desmear the through holes of the PWB and this prepared the through holes for the application of the electroplated-on metal.

The alkaline permanganate treatment bath may be made from the following ingredients in the following amounts:

| | General Amounts (% by Wt.) | Preferable Amounts (% by Wt.) | Most Preferable Amounts (% by Wt.) |
| --- | --- | --- | --- |
| Sodium or Potassium Hydroxide | 2.5–6 | 3–5 | 4 |
| Sodium or Potassium Permanganate | 5–7 | 5.5–6.5 | 6 |

|  | General Amounts (% by Wt.) | Preferable Amounts (% by Wt.) | Most Preferable Amounts (% by Wt.) |
|---|---|---|---|
| Sodium or Potassium Hypochlorite | 0.1–1.0 | 0.2–0.4 | 0.3 |
| Water | Balance | Balance | Balance |

A preferred alkaline permanganate product is available as PERMOLIN 702 by Olin Hunt Specialty Products Inc. of West Paterson, N.J.

Instead of employing a secondary oxidizer in this treatment step, it may be desirable to use an electrolytic regeneration of permanganate.

Next, the permanganate-treated PWB is contacted with an aqueous neutralizer/conditioner solution comprised of water, at least one neutral or acidic reducing agent, optionally, at least one pH adjustor, and at least one polyelectrolyte polymer conditioner. This solution neutralizes any remaining permanganate residues remaining on the PWB hole surfaces and ensures that substantially all of the hole wall glass/epoxy surfaces are properly prepared to accept a continuous layer of the subsequently applied carbon black particles.

One preferred method of contacting the permanganate-treated PWB with this neutralizer/conditioner solution is to place the treated PWB in an aqueous bath containing the neutralizer/conditioner ingredients for about 1 to 20 minutes at a temperature from about 40° C. to 80° C.

Preferred acidic reducing agents include dihydrazine sulfate and hydroxylamine sulfate and other salts thereof. It may also be preferred to use an additional acidifying means or pH adjustor such as hydrochloric acid. A preferred permanganate neutralizer/conditioner treatment bath may contain the following ingredients in the following amounts:

|  | General Amounts (% by Wt.) | Preferable Amounts (% by Wt.) | Most Preferable Amounts (% by Wt.) |
|---|---|---|---|
| Dihydrazine Sulfate | 1.0–2.5 | 1.2–2.0 | 1.5 |
| Hydrochloric Acid | 0.2–2 | 0.8–1.2 | 1.0 |
| Polyelectrolyte Polymer Conditioner | 0.01–0.2 | 0.06–0.15 | 0.1 |
| Water | Balance | Balance | Balance |

Preferred polyelectrolyte polymer conditioners include cationic polyelectrolyte polyacrylamide homopolymer resin such as MAGNIFLOC cationic resins available from American Cyanimid Company of Wayne, N.J. and cationic polyamine homopolymer resins such as ETADURIN 21 available from Akzo Chemical Company of Chicago, Ill.

It is also preferred to rinse the above-treated boards in at least one water rinse between the epoxy swell treatment and the alkaline permanganate treatment and between the alkaline permanganate treatment and the neutralizer/conditioner treatment. It is also preferred to employ at least one water rinse bath after the neutralizer/conditioner treatment.

The liquid carbon black dispersion is next applied to or contacted with the neutralized/conditioned PWB. This dispersion contains three critical ingredients, namely, carbon black, one or more surfactants capable of dispersing the carbon black and a liquid dispersing medium such as water. The preferred method of applying the dispersion to the PWB include immersion, spraying or other methods of applying chemicals used in the PWB industry. A single working bath is sufficient for applying this carbon black dispersion; however, more than one bath may be used for rework or other purposes.

In preparing this liquid dispersion, the three critical ingredients and any other preferred ingredients are thoroughly mixed together to form a stable dispersion. This may be accomplished by subjecting a concentrated form of the dispersion to ball milling, colloidal milling, high-shear milling, ultrasonic techniques or other standard blending techniques. The thoroughly mixed dispersion is later diluted with more water while agitating to the desired concentration for the working bath. The preferred method of mixing is ball milling a concentrated form of the dispersion in a container having glass, mineral, or plastic beads therein for a period of about 1 to about 24 hours. This thorough mixing allows for the carbon black particles to be intimately coated or wetted with the surfactant. This mixed concentrate is then mixed with water or some other liquid dispersing medium to the desired concentration. The working bath is preferably kept agitated during both the diluting and applying steps to aid in keeping the dispersion stable.

As stated above, the carbon black particles should have an average particle diameter below about 3 microns while in the dispersion. It is desirable to have this average particle diameter of carbon black as small as possible to obtain the desired plating characteristics of substantially even plating and no plating pullaways. It is preferred that the carbon black particles have an average particle diameter from about 0.1 to about 3.0 microns, more preferably from 0.2 to about 2.0 microns, when in said dispersion. The term "average particle diameter" as employed herein in both the specification and claims refers to average mean diameter of the particles (the average by number). The average mean diameter in the dispersion may be determined through the use of either a NiComp Model 270 submicron particle size analyzer (Version 3.0) or a HIAC PA-720 automatic particle size analyzer (both available from the HIAC/ROYCO Instrument Division of Pacific Scientific of Menlo Park, Calif.).

All types of carbon blacks may be used for this invention including the commonly available furnace blacks. However, it is preferred to utilize carbon blacks which are initially acidic or neutral, i.e., those which have a pH of between about 1 and about 7.5 and more preferably between about 2 and about 4 when slurried with water. Carbon black particles of the preferred type contain between about 1% and about 10% by weight of volatiles and have an amorphous structure.

These preferred carbon black particles are also very porous and generally their surface areas are from between about 45 to about 1100, and preferably between about 300 to about 600, square meters per gram as measured by the BET method (method of Brunauer-Emmett-Teller).

Illustrative carbon blacks suitable for use of this invention include Cabot XC-72R Conductive, Cabot Monarch 800, Cabot Monarch 1300, all manufactured by Cabot Corporation of Boston, Mass. Other suitable carbon blacks include Columbian T-10189, Columbian Conductex 975 Conductive, Columbian CC-40-220, and Columbian Raven 3500, all available from Columbian Carbon Company of New York, N.Y. Monarch 800 and Raven 3500 are the two most preferred carbon blacks because of their ease of dispersion and low pH.

The term "liquid dispersing medium" as used herein in the present specification and claims includes water and polar organic solvents (both protic and aprotic). Suitable protic polar organic solvents may include lower alcohols ($C_1$–$C_4$) such as methanol, ethanol, isopropanol and isobutanol; polyhydric alcohols such as glycols (i.e. triethylene glycols); ether-alcohols such as cellosolve; organic acids, such as formic acid and acetic acid; acid derivatives such as trichloroacetic acid; and sulfonic acids such as methane sulfonic acid. Suitable aprotic polar organic solvents include aldehydes such as acetaldehyde; ketones such as acetone; aprotic aromatic solvents such as toluene and mineral spirits; aprotic halogenated hydrocarbons such as dichlorofluoromethane and dichlorodifluoromethane (FREON); dimethylformamide (DMF); N-methylpyrrolidone; dimethylsulfoxide (DMSO); and esters of carboxylic acids such as methylformate, ethylacetate and cellosolve acetate. The preferred liquid dispersing medium is water because of cost and ease of use considerations. It is preferred to utilize deionized water which is free of lime, fluorine, iodine and other impurities normally found in tap water, in order to minimize interference of foreign ions during the subsequent electroplating step.

In addition to the water and carbon black, a third critical ingredient is needed in the dispersion, namely, a surfactant capable of dispersing said carbon black in said liquid dispersing medium (i.e., compatible with said carbon black and liquid dispersing medium). One or more of these is added to the dispersion in order to enhance the wetting ability and stability of the carbon black and permit maximum penetration by the carbon black within the pores and fibers of the nonconducting layer. Suitable wetting agents include anionic, nonionic and cationic surfactants (or combinations thereof such as amphoteric surfactants). The surfactants should be soluble, stable and preferably nonfoaming in the liquid carbon black dispersion. In general, for a polar continuous phase as in water, the surfactants should preferably have a high HLB number (8-18). The preferred type of surfactant will depend mainly on the pH of the dispersion. If the total dispersion is alkaline (i.e., has an overall pH in the basic range), it is preferred to employ an anionic or nonionic surfactant. Acceptable anionic surfactants include sodium or potassium salts of naphthalene sulfonic acid such as DARVAN No. 1 (R.T. Vanderbilt Co.), ECCOWET LF (Eastern Color and Chemical), PETRO AA, PETRO ULF (Petro Chemical Co., Inc.), and AEROSOL OT (American Cyanamid). Preferred anionic surfactants include neutralized phosphate ester-type surfactants such as MAPHOS 55, 56, 8135, 60A, L6 (Mazer Chemicals Inc.). The most preferable anionic surfactant for a liquid carbon black dispersion is MAPHOS 56. Suitable nonionic surfactants include ethoxylated nonyl phenols such as POLY-TERGENT® B-Series (Olin Corporation) or alkoxylated linear alcohols such as POLY-TERGENT SL-Series (Olin Corporation).

If the total dispersion is acidic, it is preferred to employ selected anionic surfactants or cationic surfactants. An acceptable group of anionic surfactants would be the sodium or potassium salts of naphthalene sulfonic acid described above. Acceptable cationic surfactants include cetyl dimethyl benzyl ammonium chloride such as AMMONYX T (Onyx Chemical Corporation); an ethanolated alkylguanidine amine complex such as AEROSOL C-61 (American Cyanamid); lipocals; dodecyldiphenyl oxide disulfonic acid (DDODA) such as DOWFAX 2A1 (Dow Chemical); a sodium salt of DDODA such as STRODEX (Dexter Chemical Corporation); and salts of complex organic phosphate esters. Preferred surfactants include amphoteric potassium salts of a complex amino acid based on fatty amines such as MAFO 13 and cationic ethoxylated soya amines such as MAZEEN S-5 or MAZTREAT (Mazer Chemicals Inc.). Combinations of surfactants may be employed. The term "surfactant", as used herein for making the carbon black dispersion, may include other forms of dispersing agents or aids such as low molecular weight polyelectrolytes and polymers.

The amount of carbon black in the dispersion should be less than about 4% by weight of the dispersion, preferably, less than about 2% by weight. It has been found that the use of higher concentrations of carbon blacks provide undesirable plating characteristics. In the same regard, the solids content (i.e. all of the ingredients other than the liquid dispersing medium) is preferably less than 10% by weight of the dispersion, more preferably, less than about 5.6% by weight.

The three above-noted critical components of the present invention, namely, the carbon black, liquid dispersing medium and surfactant, may be employed alone to form a liquid dispersion. In some situations, it may be desirable to add other preferred ingredients to this dispersion.

One additional preferred component of the liquid carbon black-containing dispersion is a strong basic material such as an alkaline hydroxide. Suitable strong basic materials include alkali metal hydroxides such as potassium hydroxide, sodium hydroxide, and lithium hydroxide. Ammonium hydroxide or alkaline earth metal hydroxides such as calcium hydroxide may also be employed, if desired. Potassium hydroxide is the most preferred strong basic material. The term "alkaline hydroxide" is used throughout the description and claims to identify these strong basic materials. Sufficient alkaline hydroxide may be added to the liquid carbon black dispersion in a proportion sufficient to increase the pH of the resulting carbon black-containing dispersion to between about 10 and about 14, and preferably between about 10 and about 12.

Following is a typical formulation of a suitable aqueous alkaline dispersion of carbon black showing the general range of proportions as well as the preferred range of proportions for the various components:

| Component | General Range | Preferred Range |
| --- | --- | --- |
| Carbon Black | 0.1–4% by wt. | 0.15–2% by wt. |
| Surfactant | 0.01–4% | 0.05–2% |
| Alkaline Hydroxide | 0–1% | 0.4–0.8% |
| Water | Balance | Balance |

The liquid dispersion of carbon black is typically placed in a suitably agitated vessel and the printed wiring board to be treated is immersed in, sprayed with or otherwise contacted with the liquid dispersion. The temperature of the liquid dispersion in an immersion bath is maintained in the range of between about 15° C. and about 35° C. and preferably between about 20° C. and about 30° C., while the conditioned printed wiring board is immersed therein. The period of immersion generally ranges from about 1 to 10, and preferably from about 3 to 5 minutes. During immersion, the liquid carbon black-containing dispersion penetrates the holes of the printed wiring board and wets and contacts the glass fiber as well as the epoxy resin which forms the components of the insulating layer. The immersed board is then removed from the liquid carbon black-containing dispersion bath.

The carbon black-covered board is then subjected to a step where substantially all (i.e., more than about 95% by weight) of the water in the applied dispersion is removed and a dried deposit containing carbon black is left in the holes and on other exposed surfaces of the nonconducting layer. This may be accomplished by several methods such as by evaporation at room temperature, by a vacuum, or by heating the board for a short time at an elevated temperature, or by other equivalent means. Heating at an elevated temperature is the preferred method. Heating is generally carried out for between about 30 seconds and 45 minutes at a temperature of from about 75° C. to 120° C., more preferably from about 80° C. to 98° C. To insure complete coverage of the hole walls, the procedure of immersing the board in the liquid carbon black dispersion and then drying may be repeated one or more times.

This drying step yields a board which may be completely coated with the carbon black dispersion. This dispersion is not only coated on the drilled hole surfaces, which is desirable, but also entirely coats the copper plate or foil surfaces which is undesirable. Thus prior to many subsequent operations all carbon black must be removed from the copper plate or foil surfaces.

As an optional feature of the present invention, the dried deposit of carbon black in the through holes is then contacted with an aqueous alkaline solution containing an alkali metal borate. The preferred alkali metal borate is sodium borate. The preferred pH range of this alkaline solution is from about 9.5 to 11.0. The preferred bath temperature is from about 20° C. to 50° C. The functions of this step include removing excess carbon black material on the rims and inner metal walls of the PWB through holes and remove any loose carbon black particles from the through hole walls which might cause an undesirable uneven plated surface to result. The alkali metal borate also increases the surface porosity of the carbon black.

If used, the amount of alkali borate should be sufficient to remove substantially all of the loose or easily removable carbon black particles from the areas of the through holes. The preferred concentration may vary from about 2 to 50 grams per liter of water employed. This contacting step may be carried out by placing the PWB in an aqueous bath containing the alkali metal borate at a temperature from about 20° C. to 50° C. for about 20 seconds to 5 minutes.

The further removal of the carbon black, specifically from the outer copper surfaces including, especially, the rims of the drilled holes while leaving the coating intact on the glass fibers and epoxy surface of the hole walls, may be achieved by the employment of a microetch bath. Generally, this treatment is carried out at a temperature of about 20° C. to 30° C. for 35 seconds to about 3 minutes. One suitable sodium persulfate-based microetch is "BLACKHOLE MICROCLEAN I" available from Olin Hunt Specialty Products Inc. This product is preferably combined with sufficient sulfuric acid to make a microetch bath containing 100-300 grams of sodium persulfate per liter of deionized water and about 1 to 10% by weight sulfuric acid. The mechanism by which this microetch works is by not attacking the carbon black material deposited on the copper foil directly, but rather to attack exclusively the first few atomic layers of copper directly below which provides the adhesion for the coating. Hence, the fully coated board is immersed in the microetch solution to "flake" off the carbon black from the copper surfaces in the form of micro-flakelets. These micro-flakelets are removed from the microetch bath either by filtration through a pump or via a weir type filter arrangement commonly used in the PWB industry. The liquid carbon black dispersion, the alkali metal borate treatment, the microetch treatment, and the intermittent water rinses are preferably carried out by immersing the PWB in baths constructed of polypropylene or polyvinyl chloride (PVC) and kept agitated by a recirculation pump or pumped in air.

After the microetch step and a subsequent water rinse, the PWB may now either proceed to the photoimaging process and later be electroplated or be directly panel electroplated. It may be preferred to further clean the PWB with a citirc acid anti-tarnish solution or any other acid cleaner solution or both after the above microetch step.

The thus treated printed wiring board is then ready for electroplating operation which includes immersing the PWB in a suitable electroplating bath for applying a copper coating on the hole walls of the nonconducting layer.

The present invention contemplates the use of any and all electroplating operations conventionally employed in applying a metal layer to the through hole walls of a PWB. Therefore, this claimed invention should not be limited to any particular electroplating bath parameters.

A typical copper electroplating bath is comprised of the following components in the following proportions:

| Component | General Proportions | Preferred Proportions |
|---|---|---|
| Copper (as metal) | 2-3 oz/gal | 2.25-2.75 oz/gal |
| CoPPer Sulfate | 5-10 oz/gal | 6-9 oz/gal |
| 98% Concentrated H$_2$SO$_4$ (by weight) | 23-32 oz/gal | 27-30 oz/gal |
| Chloride Ion | 20-100 mg/l | 40-60 mg/l |

The electroplating bath is normally agitated and preferably maintained at a temperature of between about 20° C. and 25° C. The electroplating bath is provided with anodes, generally constructed of copper, and the printed wiring board to be plated is connected as a cathode to the electroplating circuit. For example, a current of about 30 amps per square foot is impressed across the electroplating circuit for a period of between about 40 and 60 minutes in order to effect copper plating on the hole walls of the nonconducting layer positioned between the two plates of copper up to a thickness of about 1 mil ±0.2 mil. This copper plating of the hole wall provides a current path between the copper layers of the printed wiring board. Other suitable electroplating conditions may be employed, if desired. Other electroplating bath compositions containing other copper salts or other metal salts such as salts of nickel, gold, palladium, silver and the like may be employed, if desired.

The printed wiring board is removed from the copper electroplating bath and then washed and dried to provide a board which is further processed. For example, the PWB may be subjected to a tin-lead electroplating operation.

The following examples are presented to define the invention more fully without any intention of being limited thereby. All parts and percentages are by weight unless otherwise explicitly specified.

PRINTED WIRING BOARD SPECIFICATIONS

Several similar laminated double-sided and multilayer printed wiring boards were treated in the following Examples and Comparisons. The double-sided printed wiring boards were each comprised of two 35 micron thick copper plates secured by pressure to opposite sides of an epoxy resin-glass fiber layer. The epoxy resin-glass fiber layer for these double-sided boards was about 1.55 mm thick for each board. These double-sided printed wiring boards were about 15 centimeters wide and about 24 centimeters in length. There were about 100 to 200 holes, each about 1.0 millimeters in diameter, drilled through the copper plates and epoxy resin-glass fiber layer of each of these double-sided boards.

The multilayer printed wiring boards were comprised of four 35 micron thick copper plates secured by pressure fusing them with epoxy resin-glass fiber layers in an alternating fashion These printed wiring boards were about 15.24 centimeters wide and about 22.86 centimeters in length. There were about 500 to about 1,000 holes, each about 1.0 millimeter in diameter drilled through the copper plates and epoxy resin-glass fiber layer of each of these double-sided boards.

EXAMPLE 1

Drilled double-sided printed wiring boards described above were prepared for copper electroplating their through holes by first mechanical scrubbing the surfaces of the boards and then immersing them in the following sequence of aqueous baths (each about 132 liters in volume, unless specified otherwise) for the indicated times:
 1. Epoxy swell (5 minutes).
 2. Rinse with tap water (1 minute).
 3. Rinse with tap water (2 minutes).
 4. Permanganate desmear (15 minutes).
 5. Rinse with tap water (2 minutes).
 6. Rinse with tap water (3 minutes).
 7. Neutralizer-conditioner (5 minutes).
 8. Rinse with tap water (1 minute).
 9. Rinse with tap water (1 minute).
 10. Carbon black preplating dispersion (4 minutes). (Dry at 93° C for 20 minutes.)
 11. Rinse with tap water (30 seconds).
 12. Sodium persulfate microetch (1 minute).
 13. Rinse with tap water (2 minutes).
 14. Citric acid spray.
 15. Acid Cleaner Solution (3 minutes)
 16. Rinse with tap water (1 minute)
 17. Rinse with tap water (1 minute)
 18. Microetch (10 seconds)
 19. Rinse with tap water (2 minutes)
 20. 20% $H_2SO_4$ (2 minutes)
 21. Acid Copper Plating (5 minutes)
 22. Rinse with tap water (2 minutes)

Bath 1 was an aqueous solution containing an epoxy resin swell formulation comprised of butyl cellosolve (6% by wt.), butyl carbitol (9% by wt.), ethylene glycol (7.5% by wt.), sodium hydroxide (about 2% by wt.), and the balance deionized water. The bath was heated to about 60° C. to facilitate this swelling. This swell formulation is available under the trademark "PERMOLIN 701" by Olin Hunt Specialty Products Inc. of West Paterson, N.J.

Bath 4 was an aqueous solution containing potassium permanganate (6% by wt.), sodium hydroxide (4% by wt.), and sodium hypochlorite (0.3% by wt.) and the balance being deionized water which facilitate the removal of the epoxy resin smear over the inner layers of the drilled through holes. The bath was heated to about 71° C. to facilitate smear removal. This smear removal formulation is available under the trademark "PERMOLIN 702" by Olin Hunt Specialty Products Inc. of West Paterson, N.J.

Bath 7 was an aqueous solution containing a permanganate neutralizer formulation comprised of dihydrazine sulfate (1.1% by wt.), hydrochloric acid (5% by wt.), a cationic homopolymer (0.1% by wt.), and balance being deionized water. The homopolymer was the polyamine polyelectrolyte, ETADURIN 21. This solution both reduces the insoluble manganese salts, rendering them water soluble, and also prepares the glass surfaces in the through holes as a cationic entity for the adsorption of the anionic carbon black. Bath 7 was heated to about 60° C. to facilitate dissolution. ETADURIN 21 is available from Akzo Chemical Company of Chicago, Ill.

Bath 10 is a room temperature deionized water bath containing the carbon black preplating formulation. This bath consisted of: 0.06% by weight anionic surfactant [MAPHOS 56—an anionic surfactant produced by Mazer Chemicals of Gurnee, Ill. (90% by wt. surfactant, 10% by wt. $H_2O$)], 0.46% by wt. potassium hydroxide [solid potassium hydroxide pellets (86% by wt. KOH, 14% by wt. $H_2O$)], 0.21% by wt. carbon black [RAVEN 3500 carbon black produced by Cabot Corporation], and the balance of the bath was deionized water. This carbon black dispersion was prepared by milling a concentrated form of this dispersion in a pebble mill containing stone pebbles so that the concentration of pebbles occupied about one third of the mill volume. The surfactant was dissolved in deionized water-potassium hydroxide to give a continuous phase. Then, the carbon black was added. Milling time was six hours. After milling, the concentrate was diluted with sufficient deionized water to make the dispersion in the above-indicated proportions.

After Bath 10, the boards were placed in a hot air recirculation oven and heated to 93° C. for 20 minutes. This drying step removed the water from the carbon coating on the boards, thereby leaving a dried deposit of carbon black all over the boards and in the through holes of the boards. This drying promotes adhesion between the carbon black and the nonconductive surfaces of the boards.

Bath 12 was a room temperature aqueous bath and contained 200 grams of sodium persulfate per liter of deionized water and 1.0% by wt. of concentrated sulfuric acid. Its function was to microetch the copper surfaces of the boards so as to remove the deposited carbon black from the surfaces. It does not act on the epoxy-glass surfaces. This sodium persulfate microetch was made from "BLACKHOLE MICROCLEAN 1" and is available from Olin Hunt Specialty Products Inc. of West Paterson, N.J.

After treatment with this sequence of baths, the printed wiring boards were sprayed with an anti-tarnish solution consisting of an aqueous solution of citric acid.

The printed wiring boards were passed through the spray on a conveyorized unit at 3 feet per minute where the solution was 43° C. A typical spray pressure was 14-15 psig.

Bath 15 was an aqueous acid cleaner solution containing sulfonic acid (about 10% by wt.) and a detergent (about 5% by wt.). This bath was heated to 45° C. to facilitate cleaning the copper surface. This copper cleaning solution is made by diluting VERSACLEAN 400 with deionized water (1:3 dilution). VERSACLEAN 400 is available from DuPont Electronic Chemicals of Wilmington, Del.

Bath 18 was a room temperature aqueous bath and contained 100 grams of sodium persulfate per liter of deionized water and 1% by wt. of concentrated sulfuric acid. This bath and bath 20 are both part of a standard electroplating operation. Its function was to microetch the copper surfaces of the boards to prepare a rough surface for electroplating. It does not act on the epoxy-glass surfaces.

Bath 20 was an aqueous solution containing 20% by wt. concentrated sulfuric acid. Immersion of boards in this solution, prior to copper electroplating, prevents excessive carry-over of water from the rinse bath to the copper electroplating bath, Bath 21.

Rinse baths 2, 3, 5, 6, 8, 9, 11, 13, 16, 17, 19, and 22 were employed to prevent the carryover of chemicals from one treatment bath into the next. These rinse baths were at room temperature.

After the dilute sulfuric acid treatment in bath 20, the boards were placed in aqueous electroplating bath 21, provided with agitation means and heating means, and which contained an electrolyte bath comprised of the following:

| Aqueous Plating Bath Composition | |
|---|---|
| Component | Proportion |
| Copper (as metal) | 2.5 oz./gal. |
| Copper Sulfate | 6.2 oz./gal. |
| 98% Concentrated $H_2SO_4$ (by weight) | 30 oz/gal. |
| Chloride Ion | 40 mg/l |
| Water | Balance |

The printed wiring boards were connected as a cathode in the electroplating vessel having a volume of about 284 liters. Copper bars were immersed in the electrolyte and connected to the cell circuits as anodes. The copper bars had a length of about 46 cm; a width of about 9 cm, and a thickness of about 4 cm. Each face was about 414 square cm. A direct current of 30 amps per square foot was impressed across the electrodes in the electroplating bath for approximately 5 minutes. The bath was maintained at a temperature of about 25° C. during this period and agitation was effected by air sparging. At the end of this period, the printed wiring boards were disconnected from the electroplating circuit, removed from the electrolyte, washed with tap water, and dried.

Arbitrarily chosen areas, measuring 10 mm × 18 mm, were cut from the printed wiring boards, using a Di-Acro Houdaille No. 1 punch. The through holes were then sectioned into semi-circles using an Isomet II-1180 low speed saw. Back-lighting analysis was carried out by examining the surface of the sectioned through holes with an optical microscope. Each sample was illuminated from behind. The analysis of about 50 samples from these plated boards showed that about 87%±4% of the glass surfaces in the through hole samples had been electroplated. Our experience with back-lighting, as a technique to evaluate the probability to completely electroplate the through hole surface, shows that a minimum of 85% of the through hole must be copper covered after five minutes electroplating. Accordingly, the PWB's used in this example were successfully electroplated.

COMPARISON 1

The above process was repeated with similar double-sided PWB's except Bath 7 did not contain the homopolymer polyelectrolyte ETADURIN 21, and Bath 7 was followed by immersion of the PWB in a cleaner bath for five minutes (and subsequent cold water rinse for two minutes), then immersion in a conditioner bath for four minutes (and subsequent cold water rinse for two minutes), followed by immersion in Bath 10 above. The cleaner bath, employed in this comparison, was an aqueous solution containing a cleaner formulation principally comprised of monoethanolamine, ethylene glycol, and a nonionic surfactant in water to remove grease and other impurities from the hole wall surfaces of the boards. The cleaner bath was heated to about 60° C. to facilitate this cleaning operation. This cleaner formulation is available as "BLACKHOLE CLEANER 2" from Olin Hunt Specialty Products Inc. of West Paterson, N.J.

The conditioner bath was an aqueous solution of monoethanolamine and Sandolec CF. This formulation prepares the boards and makes its through holes more receptive to the carbon black dispersion. Sandolec CF is made by Sandoz Chemical; this formulation is available as "BLACKHOLE CONDITIONER" from Olin Hunt Specialty Products Inc. of West Paterson, N.J. Back-lighting analysis, as in Example 1, after 5 minutes electroplating showed that about 93%±4% of the glass surfaces in through hole samples had been electroplated.

However, this process required two additional treatment baths and subsequent rinses. Thus, the overall cost of this process was greater and the length of time needed to treat each PWB was longer. Accordingly, the process is a less attractive commercial process than that of Example 1.

EXAMPLE 2

Example 1 was repeated using both double-sided and multilayer PWB's except that sodium persulfate (0.3% by wt.) was substituted for the sodium hypochlorite in Bath 4, and the electrolytic copper deposition time was extended from 5 to 55 minutes followed by 5 minutes electrolytic tin-lead solder deposition. The following additional baths were employed to carry out this electrolytic tin-lead solder deposition:

23. Rinse with tap water (2 minutes)
24. Acid pre-dip (2 minutes)
25. Tin-Lead plating (5 minutes)
26. Rinse with tap water (2 minutes)

Bath 24 was an aqueous solution containing 20% by wt. alkane sulfonic acid. Immersion of boards in this solution, prior to tin-lead electroplating, prevents excessive carryover of water from the rinse bath to the tin-lead electroplating bath, Bath 25.

Rinse bath 23 was employed to prevent carryover of chemicals from one treatment bath into the next. This rinse bath was at room temperature.

The tin-lead electroplating bath comprised of the following components in the following proportions:

|  | Range | Optimum |
|---|---|---|
| Tin Metal | 10-22 g/L | 15-16 g/L |
| Lead Metal | 5-11 g/L | 7-8 g/L |
| Alkane Sulfonic Acid | 16-30% by wt. | 18-26% by wt. |
| Temperature | 24-30° C. | 27° C. |
| Current Density | 10-40 A/sq. ft. | 20 A/sq. ft. |

At the end of this period, the printed wiring board was disconnected from the electroplating circuit, removed from the electrolyte, washed with tap water in room temperature rinse bath 26, and dried.

COMPARISON 2

The process outlined in Comparison 1 was repeated with both double-sided and multilayered PWB's, except that sodium persulfate (0.3% by wt.) was substituted for sodium hypochlorite in Bath 4, and the board processing time extended to include 55 minutes electrolytic copper deposition and 5 minutes electrolytic tin-lead solder deposition.

COMPARISON 3

The process outlined in Comparison 2 was repeated with both double-sided and multilayered PWB's, except that a permanganate neutralizer, PERMOLIN 703 which is available from Olin Hunt Specialty Products Inc., was substituted for the conditioner-neutralizer in Bath 7 and the conditioner bath was removed. The cleaner bath was still employed.

An examination of the through holes of the resulting electroplated printed wiring boards of Example 2 and Comparisons 2 and 3 were conducted, and the following defined parameters were evaluated:

| | |
|---|---|
| Pullaway (PA): | Adhesion failure of the plated copper to the hole wall. |
| Epoxy voids (EV): | Absence of plated copper on the resin surfaces. |
| Glass voids (GV): | Absence of plated copper on the glass surfaces. |
| Rim voids (RV): | Absence of plated copper at or just below the rim of the through holes. |
| Innerlayer contamination (ILC): | (for multilayer boards only) Residual carbon black material on the copper interconnects in the through hole. |
| Innerlayer fold void (ILFV): | (for multilayer boards only) Absence of plated copper at the resin innerlayer-copper interconnect. |

A rating system for these defects was devised by assigning numbers from 1 to 4 depending on the severity of the defect; 1 indicates no defect was observed and 4 indicates the defect was observed on essentially all of the through holes inspected.

32 cross-sections with 5 through holes per cross-section totalling 160 through holes were evaluated each for Example 2 and Comparisons 2 and 3.

The pullaway rating determined was after thermal shock testing in which the sample was floated in a molten solder bath at 288° C. for ten seconds.

|  | PA | GV | EV | RV | ILC | ILFV |
|---|---|---|---|---|---|---|
| Example 2 | | | | | | |
| Double-sided | 1.5 | 1 | 1 | 1 | N.M. | N.M. |
| Multilayer | 1.2 | 1 | 1 | 1 | 1 | 1 |
| Comparison 2 | | | | | | |
| Double-sided | 1.8 | 1 | 1 | 1 | N.M. | N.M. |
| Multilayer | 1.2 | 1 | 1 | 1 | 1 | 1 |
| Comparison 3 | | | | | | |
| Double-sided | 1.2 | 1.3 | 1 | 1 | N.M. | N.M. |
| Multilayer | 1.2 | 2.1 | 1.1 | 1 | 1 | 1 |

N.M. = Not measured

It is clearly evident by comparing the results of Example 2 to Comparisons 2 and 3 that this invention produces results equal to or better than the processes of Comparisons 2 and 3 while offering a considerably shortened processing time and fewer treatment baths.

Comparing the results of Example 2 and Comparison 2 to Comparison 3 with respect to glass voids (GV) shows that the presence of the homopolymer polyelectrolyte dissolved in the neutralizer solution improves glass conditioning (i.e., eliminating all glass voids in both double-sided and multilayer PWB in Example 2 and Comparison 2).

While the invention has been described above with reference to specific embodiments thereof, it is apparent that many changes, modifications, and variations can be made without departing from the inventive concept disclosed herein. Accordingly, it is intended to embrace all such changes, modifications, and variations that fall within the spirit and broad scope of the appended claims. All patent applications, patents, and other publications cited herein are incorporated by reference in their entirety.

What is claimed is:

1. The process for electroplating a metal layer to the surface of a nonconductive material which comprised the steps:
    (a) contacting said substrate surface with an alkaline permanganate solution for an effective time and at an effective concentration and at an elevated temperature to prepare said substrate surface for a metal layer to be electroplated thereto;
    (b) then contacting said substrate surface with an aqueous neutralizer/conditioner solution, said solution comprising water, at least one neutral or acidic reducing agent, and at least one polyelectrolyte polymer conditioner;
    (c) then contacting said substrate surface with a liquid dispersion of carbon black comprised of:
        (1) carbon black particles having an average particle size of less than about 3 microns in said dispersion;
        (2) an effective dispersing amount of a surfactant which is compatible with said carbon black; and
        (3) a liquid dispersing medium, wherein the amount of carbon black is sufficient to coat substantially all of the nonconducting substrate surface and is less than about 4% by weight of said liquid dispersion;
    (d) separating substantially all of the liquid dispersing medium from said applied dispersion, thereby depositing said carbon black particles in a substantially continuous layer on said nonconductive substrate surface; and (e) electroplating a substantially continuous metal layer over the deposited carbon black layer on said nonconducting substrate surface.

2. The process of claim 1, wherein said alkaline permanganate is made from a mixture comprising water, an alkaline hydroxide, an alkaline permanganate, and optionally, a secondary oxidizer selected from the group consisting of an alkaline hypochlorite or an alkaline persulfate.

3. The process of claim 1, wherein said permanganate contacting step (a) is preceded by a solvent swell treatment.

4. The process of claim 1 wherein said reducing agent employed in step (b) is selected from the group consisting of dihydrazine sulfate and hydroxylamine salts.

5. The process of claim 1, wherein said polyelectrolyte polymer conditioners employed in step (b) is selected from the group consisting of cationic polyelectrolyte, polyacrylamide homopolymer resins and cationic polyelectrolyte polyamine homopolymer resins.

6. The process of claim 1, wherein said liquid carbon black dispersion further comprises a sufficient amount of at least one alkaline hydroxide to raise the pH of said liquid dispersion in the range from about 10 to 14.

7. The process of claim 1, wherein said liquid dispersion contains less than about 10% by weight solids constituents.

8. The process of claim 1 wherein said liquid dispersing medium is water.

9. The process of claim 1, wherein said conductive metal is copper.

10. The process for electroplating the walls of through holes in a laminated printed wiring board comprised of at least one nonconducting layer laminated to and alternating with at least two separate conductive metal layers, which comprises the steps:
(a) contacting said substrate having said through holes with an alkaline permanganate solution for an effective time and at an effective concentration and at an elevated temperature to desmear the walls of said through holes;
(b) then contacting said substrate having said through holes with a neutralizer/conditioner solution, solution comprising a mixture of water, at least one neutral or acidic reducing agent, and at least one polyelectrolyte polymer conditioner;
(c) then contacting said substrate having said through holes with a liquid dispersion of carbon black comprised of:
  (1) carbon black particles having an average particle size of less than about 3.0 microns in said dispersion;
  (2) an effective dispersing amount of a surfactant which is compatible with said carbon black; and
  (3) a liquid dispersing medium, wherein the amount of carbon black is sufficient to coat substantially all of said nonconducting surfaces of the hole walls and is less than about 4% by weight of said liquid dispersion;
(d) separating substantially all of the liquid dispersing medium from said applied dispersion, thereby depositing said carbon black particles in a substantially continuous layer on said nonconducting portions of said hole walls;
(e) microetching said metal layers of said printed wiring board to remove deposited carbon black therefrom; and
(f) later electroplating a substantially continuous metal layer over the deposited carbon black layer on said nonconducting portions of hole walls, thereby electrically connecting said metal layers of said printed wiring board.

11. The process of claim 10 wherein said liquid carbon black dispersion further comprises a sufficient amount of at least one alkaline hydroxide to raise the pH of said liquid dispersion in the range from about 10 to 14.

12. The process of claim 11 wherein said alkaline hydroxide is potassium hydroxide.

13. The process of claim 12 wherein said liquid dispersion contains less than about 10% by weight solids constituents.

14. The process of claim 13 wherein said carbon black particles have an initial pH from about 2 to 4.

15. The process of claim 14 wherein said surfactant is a phosphate ester anionic surfactant.

16. The process of claim 10 wherein said conductive metal is copper.

17. The process of claim 10 wherein said liquid dispersing medium is water.

18. The process of claim 10 wherein said microetch in step (c) comprises sodium persulfate and sulfuric acid.

* * * * *